United States Patent [19]
Thomas

[11] Patent Number: 4,947,133
[45] Date of Patent: Aug. 7, 1990

[54] METHOD AND APPARATUS FOR AUTOMATIC SIGNAL LEVEL ADJUSTMENT

[75] Inventor: Louis D. Thomas, Cardiff, Wales

[73] Assignee: National Research Development Corporation, London, England

[21] Appl. No.: 145,099

[22] Filed: Jan. 19, 1988

[30] Foreign Application Priority Data

Jan. 22, 1987 [GB] United Kingdom ............... 8701365

[51] Int. Cl.[5] ..................... H03K 5/08; H03G 3/00; H03G 3/10
[52] U.S. Cl. .................................. 328/168; 328/162; 307/264; 307/493; 330/279
[58] Field of Search ............... 328/168, 136, 140, 162; 307/493, 354, 264; 330/278, 279, 136, 129; 333/14

[56] References Cited

U.S. PATENT DOCUMENTS

| | | | |
|---|---|---|---|
| 4,187,477 | 2/1980 | Endoh et al. | 455/72 |
| 4,250,470 | 2/1981 | Szarvas | 455/72 |
| 4,377,788 | 3/1983 | Christopher et al. | 330/278 |
| 4,415,866 | 11/1983 | Wermuth | 330/278 |
| 4,535,471 | 8/1985 | Kukoda | 455/72 |

FOREIGN PATENT DOCUMENTS

| | | |
|---|---|---|
| 0118144 | 9/1984 | European Pat. Off. |
| 0969507 | 9/1964 | United Kingdom . |
| 1108413 | 4/1968 | United Kingdom . |
| 1432237 | 4/1976 | United Kingdom . |
| 1451154 | 9/1976 | United Kingdom . |
| 1599401 | 9/1981 | United Kingdom . |
| 2147165 | 5/1985 | United Kingdom . |
| 2189953 | 11/1987 | United Kingdom . |

Primary Examiner—Timothy P. Callahan
Attorney, Agent, or Firm—Cushman, Darby & Cushman

[57] ABSTRACT

An input signal passes by way of a variable gain amplifier to an output terminal. In addition the input signal is applied to a peak detector and then a control signal is derived by applying a smoothing function taking into account a predetermined number of peak values. A selected gain function is applied to the control signal. The control signal is preferably also multiplied by a compression control signal which acts on individual half cycles to bring all peak values in the output signal to the same value.

15 Claims, 5 Drawing Sheets

METHOD AND APPARATUS FOR AUTOMATIC SIGNAL LEVEL ADJUSTMENT

The present invention relates to methods and apparatus for automatic signal level adjustment where levels vary both on relatively long and short timescales. The invention is particularly, but not exclusively, useful in processing speech signals.

Large variations occur between the speech levels generated by the loudest and quietest speakers and in addition the nature of speech is such that considerable level variations occur in the speech levels generated by a single speaker. These varying speech levels make it difficult to optimise the noise performance of systems employing electrical signals derived from speech. Usually speech, or other audio signal, loudness or envelope control is used to raise the level of quiet speech signals so that they are comparable with loud speech signals and it is also known to provide waveshape compression to deal with variations in the level of an individual's speech (see British Patent Specification 1,599,401). A disadvantage of known envelope level controllers is that the time constants used are a compromise between responding to low and high frequencies with the result that where frequencies vary considerably, as in speech, performance is not optimum.

According to a first aspect of the present invention there is provided apparatus for automatic signal level adjustment comprising processing means for forming a first control signal which is a function of a weighted sum of a predetermined number, greater than one, of successive half cycle peak magnitudes of an input signal, whereby the first control signal is dependent on the frequency content of the input signal, the processing means being arranged to operate on the input signal using a first control transfer function to provide an output signal which depends on the first control signal.

An envelope control signal can be provided by detecting each peak magnitude and forming a weighted sum, where the number of peaks taken and the weighting represents a suitable time constant. For this reason the first control signal can be considered as, and will be referred to as, an envelope control signal.

Since the weighted sum is taken over a predetermined number of half cycles each having a duration which varies with frequency, the time constant of envelope control varies with frequency overcoming, at least to some extent, the above mentioned disadvantage.

The envelope control signal may be changed at discrete intervals which also depend on the frequency content of the input signal and in particular the envelope control signal may be changed at zero crossings.

Preferably, the envelope control signal is a function of weighted values of consecutive half cycle peak magnitudes of the input signal.

The first (or envelope) control transfer function may be provided by a digital low-pass filter clocked at zero crossings of the input signal.

The processing means may also be arranged to derive a second or compression control signal representative of input signal peak magnitudes, each peak magnitude being derived over a respective portion of the input signal, and the processing means also being arranged to operate on each portion of the input signal using a compression control transfer function to vary the output signal in accordance with the compression control signal derived from that portion with the result that at least a class of the said peak magnitudes are brought to substantially the same magnitude in the output signal.

Where the processing means derives a compression control signal, the processor may be arranged to control the value of this signal in accordance with the value of the envelope control signal.

According to a second aspect of the present invention there is provided a method of automatic signal level adjustment comprising the steps of forming an envelope control signal which is a function of a weighted sum of a predetermined number, greater than one, of successive peak magnitudes of an input signal, whereby the envelope control signal is a function of the frequency content of the input signal, and operating on the input signal using an envelope control transfer function to provide an output signal which depends on the envelope control signal.

In the first and second aspects of the invention, at least some of the weights used in forming the weighted sum are different from one another. The function of the weighted sum is preferably in the form of an average of the weighted peak magnitudes.

A method of the second aspect of the invention may include the derivation of a compression control signal.

According to a third aspect of the present invention there is provided apparatus for automatic signal level adjustment comprising processing means for forming envelope and/or compression control signals which are a function of the envelope of an input signal and peak magnitudes of the input signal, respectively, each control signal being derived over a respective portion of the input signal and the processing means being arranged to operate on each portion of the input signal in accordance with the value of the envelope and/or compression control signals derived from that portion.

In this specification the term "half cycle" means that portion of a signal which extends between zero crossings, and the term does not imply that successive such portions are similar in waveshape or duration.

Certain embodiments of the invention will now be described by way of example with reference to the accompanying drawings, in which.

Figure 1:
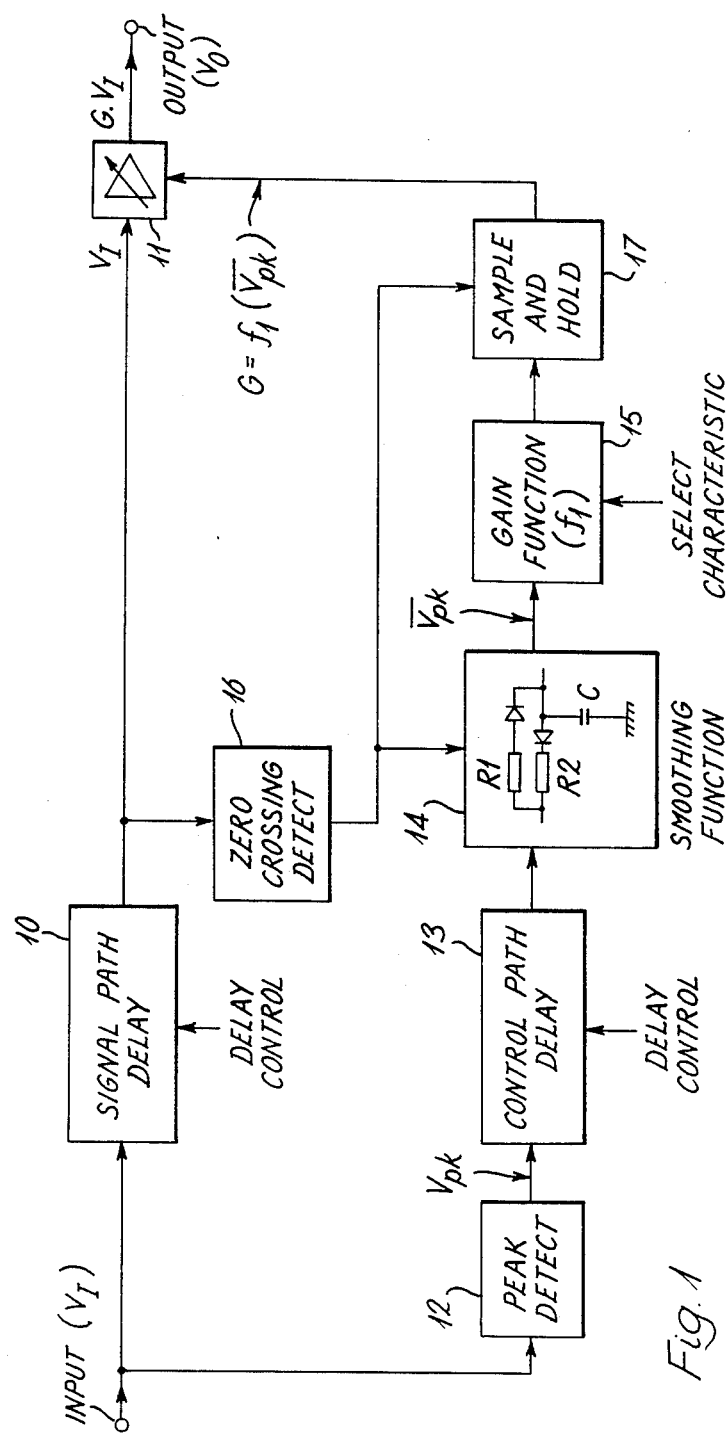
FIG. 1 is a block diagram of a speech controller with envelope control.

The object of FIG. 1 is to provide envelope level control for an electrical signal representative of an audio signal; that is the signal is controlled in dependence upon the magnitude of its envelope. The method used is to sense the magnitude of the envelope by considering peaks in the input waveform over a predetermined number of peaks, rather than over a predetermined period, and to form a gain control signal for an amplifier which depends on the magnitudes of the peaks.

Figure 4:
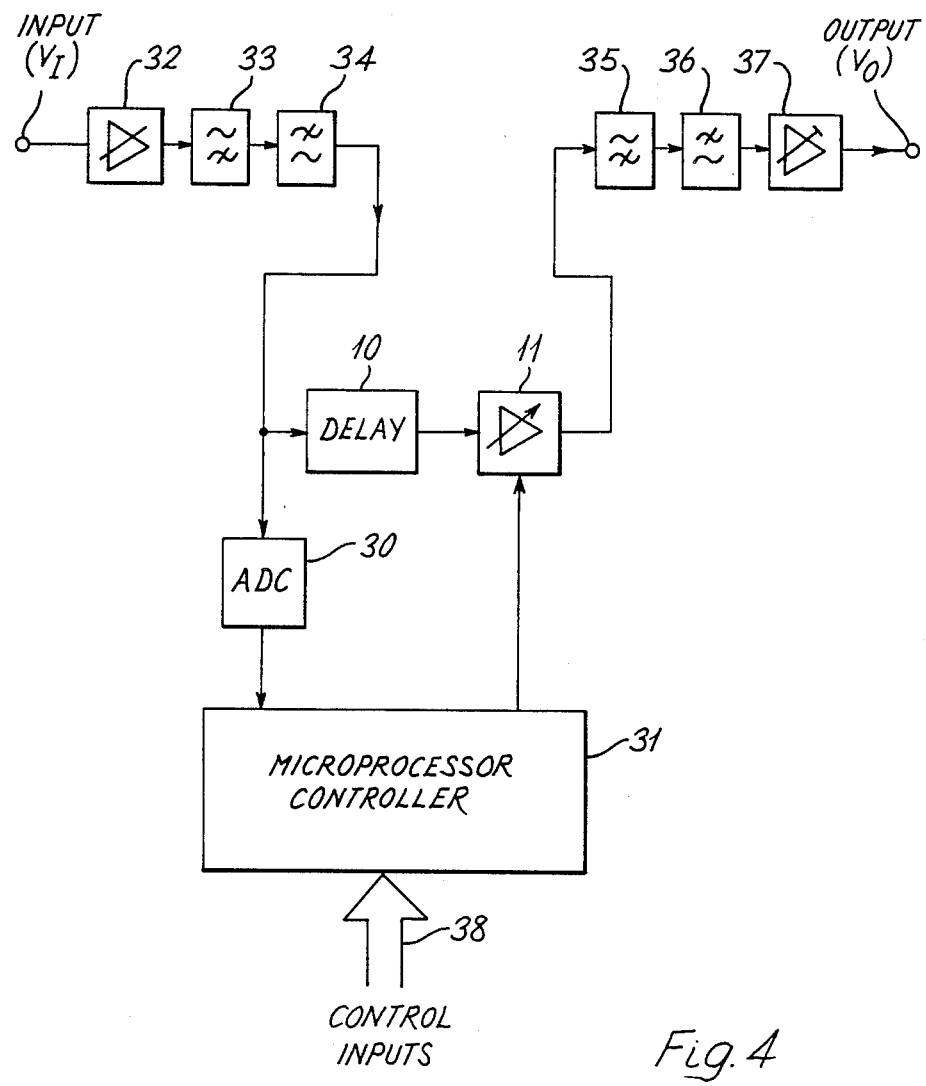
FIG. 4 is a block diagram illustrating the use of a microprocessor in the controllers of FIGS. 1, 2 and 3.

In FIG. 1 a speech signal which has been processed in a way described later in connection with FIG. 4 is applied to an input terminal where it passes to a signal path and a control path. As will be explained in connection with FIG. 4, the signal path is analogue, and the control path is digital and is run largely by a microprocessor. The signal path comprises a delay 10 and an amplifier 11, the gain of which is controlled by the output of the control path.

In the control path, input signals from the input terminal are passed to a detector 12 which detects peaks between zero crossings. The output of the detector 12 is transferred by way of a control path delay 13 to smoothing means 14 which may operate according to a number of different smoothing functions, one of which is illustrated within the outline of the means 14. Each smoothing function takes account in a different way of a predetermined number of previous peaks to provide a signal which may approximate to the envelope of the speech signal. The signal so provided is applied to a gain selector 15 which has a selectable characteristic relating input level to output level. Although the smoothing means 14 is shown as an analogue circuit it is, in this embodiment, in digital form and only approximately represented by the analogue components shown in 14. The smoothing means 14 receives an input from a zero crossing detector 16 to cause a new smoothed output to be formed taking into account a new peak at each zero crossing. The zero crossing detector 16 is also connected to control a sample and hold circuit 17 which samples the output of the gain function so that the gain signal applied to the amplifier 11 is changed only at zero crossings occurring at the output side of the delay 10.

The smoothing function for the means 14 may be of several different types. For example a subroutine run by the above mentioned microprocessor may simulate a series-resistance parallel-capacitance circuit by taking a predetermined number, for example three, of previous peak magnitudes, weighting them exponentially and summing them. Alternatively two such RC circuits may be simulated, the one with the highest output magnitude being selected as the output of the means 14. However, the preferred smoothing function is that illustrated within the outline of the means 14; that is two separate time constants $R_1C$ and $R_2C$. By virtue of the diode shown the time constant $R_1C$ is only applicable when a current peak is larger than a previous peak and two time constants apply respectively to upward trends, with a relatively short time constant, and downward trends, where a comparatively long time constant is required.

Thus since digital values are used, two weighted sums are formed; one, corresponding to $R_1C$, by summing and weighting a predetermined number of those successive peak magnitudes which ascend in value; and the other, corresponding to $R_2C$, by summing and weighting a predetermined number of successive peaks regardless of relative successive values.

One of the advantages of the digital circuit described is that the number of peaks considered in deriving the output of the smoothing function can be selected as required by selecting the number of previous peak magnitudes stored by the microprocessor and used by the subroutine. Thus however high or low a previous peak outside the stored range was, its influence is no longer felt. This is unlike an analogue RC circuit where the usual exponential decay of previous peaks stored in the capacitor C extends, theoretically, infinitely far back in time. However a direct digital simulation of an analogue filter may be used if required.

The gain selector 15 can be implemented by means of a look-up table having groups of values corresponding to different input/output level characteristics. The use of different characteristics is known and is not discussed here except to say that some of the different types of characteristics which can be provided are loudness compressors with compression ratios which vary with input level and between compressors, limiters with or without an amplitude transfer characteristic shaped so as not to enhance low level signals and "noise gate" characteristics.

For envelope level control alone the delay 10 of the signal path should be between 0 and 3 msecs but it is preferable for the difference between the delays 10 and 13 to be about 3 msecs in order to provide a small amount of "anticipation" for the envelope control action. In practice therefore the delay 10 can be given a convenient predetermined value and then the delay 13 is adjusted until satisfactory results are obtained.

Some advantages of the type of envelope level controller shown in FIG. 1 will be explained below in connection with FIG. 2.

Figure 2:
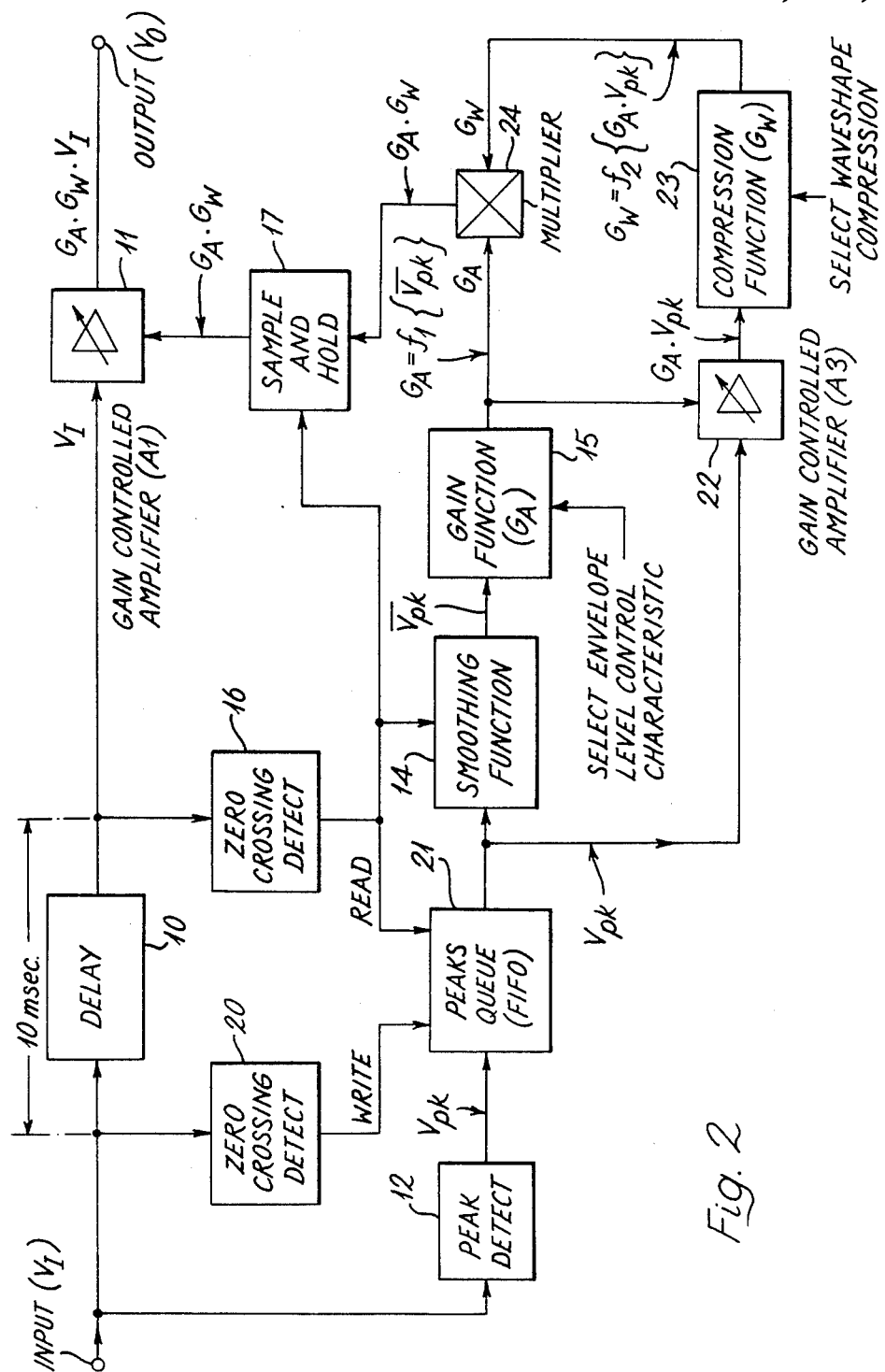
FIG. 2 is a block diagram of a speech controller with envelope level control and waveshape compression.

Combined envelope level control and waveform compression is given by the arrangement shown in FIG. 2 where functions have the same designations as in FIG. 1 except that the delay 10 in the main signal path now has a delay of typically 10 msecs as shown. In addition to providing envelope control in a way which is similar to that described in connection with FIG. 1, the arrangement of FIG. 2 also provides waveshape compression.

Each time a zero crossing detector 20 detects a zero, the peak detected by the detector 12 in the previous zero crossing interval (that is since the previous zero crossing) is read in to a first-in first-out peaks queue store 21. As in FIG. 1, signals from the input terminal pass to the delay circuit 10 which has the detector 16 at its output. This detector then causes each zero crossing to read out from the queue 21 the peak which that zero crossing read in at the beginning of the delay 10. The means 14 and the gain selector 15 derive an envelope control signal from the peaks read out of the queue 21 in the way described in connection with FIG. 1 but a waveshape compression signal is also derived. Each peak is applied to an amplifier 22 whose gain is controlled by the envelope control signal so that its output is independent of the average loudness of current speech over a predetermined range of loudness. The amplifier 22 is connected to a compression selector 23 in the form of a look-up table containing a number of compression functions in which output level depends upon input level. By entering the table at different points different waveshape compression functions may be selected. In general these functions are such that all input peaks are brought by the amplifier 11 to the maximum level which can be handled by circuits connected to the output of the amplifier 11, provided that these peaks are above a certain minimum value near to the noise level (see the above mentioned British Specification). The differences between the waveshape compression functions are mainly in this said minimum value and the variation in gain below this value.

The waveshape compression control signal obtained from the output of the selector 23 is applied to a multiplier 24 which also receives the envelope control signal from the gain selector 15 and thus the product of these control signals provides an overall control signal for the amplifier 11. However the sample and hold circuit 17 is connected between the multiplier 24 and the amplifier 11 to allow the zero crossing detector to sample the output of the multiplier 24 when a new zero is detected and change the value of the resultant control for the amplifier 11 at that time.

Since each peak and the zero crossing interval containing it must, for waveshape compression, be amplified using the compression control signal derived from that peak, the delay 10 delays the input signal by the longest signal period expected, so that peaks in these longest periods can be detected and the control signal applied. The lowest fundamental expected is 100 Hz for intercom and public address and 300 Hz for communications systems. The above mentioned delay of 10 msecs for the delay 10 is a practical value which has been found suitable for the former application when real and therefore imperfect filters are used in deriving the input signal.

The speech level controller of FIG. 2 provides both envelope level control and waveshape compression with the amount of waveshape compression acting independently of average talker loudness. This latter effect is achieved by using an envelope control signal ($G_A$) that maintains the average talker loudness at a constant level as the control signal at the input to a gain controller amplifier 22 ahead of the waveshape compression gain function ($G_W$). The average loudness at the input to the selector 23 is then constant and the value of ($G_W$) is the additional gain required to achieve waveshape compression:

$$V_O = G_A \cdot G_W \cdot V_I$$

where
- $V_O$ = Speech output level.
- $V_I$ = Speech input level.
- $G_A$ = System gain required to control the average speech level.
- $G_W$ = System gain required to provide waveshape compression.

The smoothing means 14 can be regarded as a low-pass digital filter and has an unusual characteristic in that the sampling period of the filter is equal to the arrival time of each new peak value and hence the filter time constant adapts to frequency of the input. This is an important feature of the level controller since a transient change in speech level is controlled within a given number of waveform half cycles and not in a fixed time period as in conventional controllers.

The level controller has a fixed delay of 10 msec in the signal path and a variable delay (Tpk) in the peaks queue in the control path.

The zero crossing detector 20 strobes each peak into the peaks queue 21 at the zero crossing at the end of each zero crossing period. The zero crossing detector 16 strobes peaks out of the peaks queue at the zero crossing at the commencement of each zero crossing period. With a sinewave input signal the delay in the peaks queue is:

$$Tpk = (0.01 - Tzc) \text{ seconds}$$

where $Tzc = 1/\text{fin}$ which equals the zero crossing period of the input sinewave of frequency fin.

Some values of Tpk as a function of input frequency are:

| fin | Tpk (msec) |
|---|---|
| 100 Hz | 5.00 |
| 1 KHz | 9.50 |
| 3 KHz | 9.85 |

The peaks queue delay therefore decreases with decreasing input frequency and provides a further useful feature by generating a control signal sooner for low frequency input waveforms. Since in speech the low frequency components have the highest energy a greater degree of control is put into effect where the changes in level are greatest.

Figure 3:
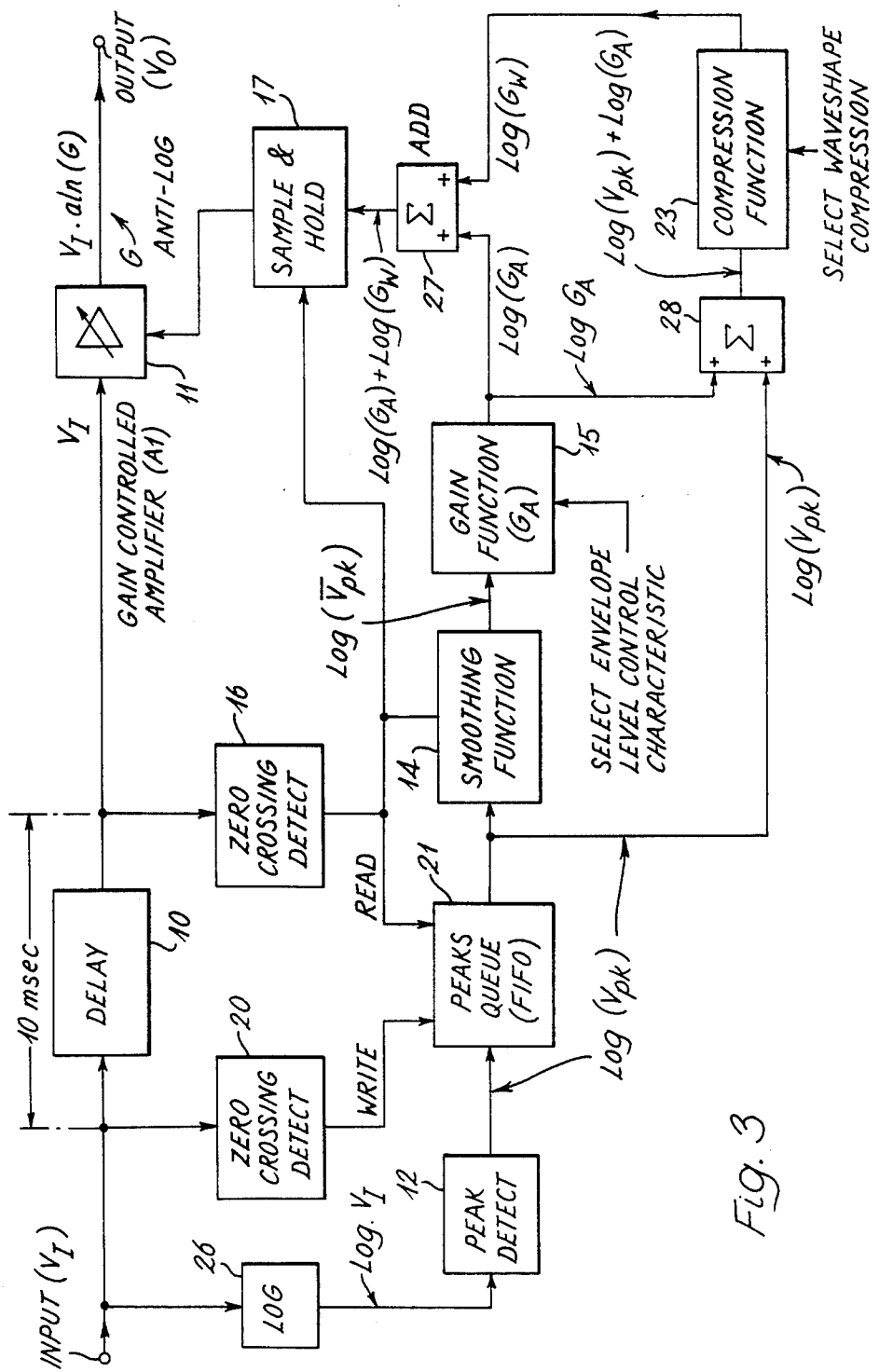
FIG. 3 is an alternative speech controller with envelope level control and waveshape compression.

An alternative to the arrangement of FIG. 2 is shown in FIG. 3 where the magnitude of the signals used in the control path is in logarithm form so allowing multiplication processes to be replaced by addition. Thus the input to the peak detector 12 passes through logarithm forming means 26 and the amplifier 11 employs an antilog function. The multiplier 24 is replaced by an addition 27 and the gain controlled amplifier 22 is replaced by an addition 28.

As has been mentioned the block diagrams of FIGS. 1, 2 and 3 will almost invariably be at least partially implemented by software run on a microprocessor but the division between hardware and software is flexible between embodiments. In one arrangement shown in FIG. 4 peak detector 12 and the zero crossing detector 20 are part of a peak detecting analogue-to-digital converter (ADC) 30. The delay 10 is formed by a charged coupled device (CCD) delay line and the gain controlled amplifier 11 is formed by a multiplying digital-to-analogue converter (MDAC). The remainder of the functions are carried out by a microprocessor controller 31 which is formed by a microprocessor and associated RAM, EPROM and interfaces, none of which are shown since they are well known. The microprocessor controller 31 contains a zero crossings queue (not shown) which enters signals representing zero crossings when they occur as indicated by the ADC 30. Neutral signals (that is not representing zero crossings) are also entered at times determined by a system clock when zero crossings do not occur and the zero crossing detector 16 detects zero crossings at the exit of the queue.

Since the software implements the process in sampling fashion the required changes in gain at the MDAC 11 do not always occur at exactly the required instant. The addition of a further zero crossing detector (not shown) at the output of the delay 10 and operating on the analogue signal may be used to achieve exact timing of the gain changes. This zero crossing detector controls a latch (not shown) positioned between the output of the controller 31 and the MDAC 11. However the uncertainty in the gain changing instant is small and a negligible reduction in performance results from the omission of the further zero crossing detector and the accompanying latch.

As shown in FIG. 4 a raw electrical signal representing speech passes through an input amplifier 32, a high pass filter 33 and a low pass filter 34. The filters 33 and 34 limit the signal to the bandwidth required for the application. As mentioned above this is typically 300 Hz to 3 KHz or 100 Hz to 5 KHz. The high pass filter 34 limits the maximum interval between zero crossings appearing at the input to the ADC 30. This is important since this interval must not exceed the signal path delay of 10 msecs if changes in waveform compression gain are to remain in synchronism with the waveform zero crossings. A similar arrangement of a high pass filter 35, a low pass filter 36 and an output amplifier 37 is connected at the output of the MDAC 11. This output filter arrangement limits the spectrum of the output waveform which is necessary when waveshape compression is used because intermodulation products broaden the spectrum beyond that of the input due to the rapidly varying gain.

The charged coupled delay may be a 256 stage device such as the RETICON RD5106. A suitable microprocessor controller is the single chip microcontroller Intel 8052.

Figure 5:
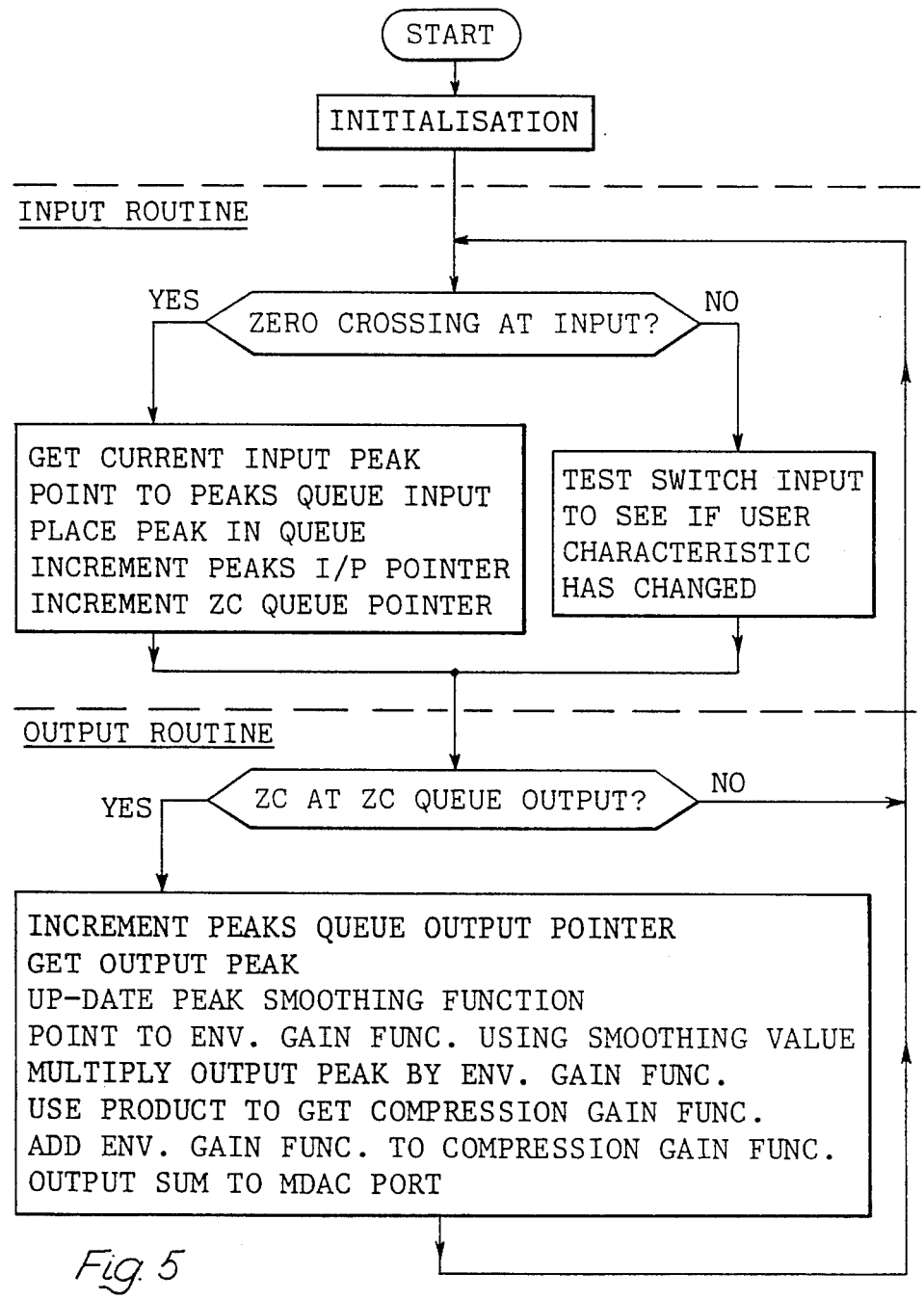
FIG. 5 is a flow chart for the controller of FIG. 4.

The microprocessor controller is programmed to follow the flow diagram of FIG. 5 which begins with the initialisation of memory areas and memory pointers. The zero crossings queue is cleared so that false zero crossings do not occur. The queue 21 has an input pointer and an output pointer and these are set with a spacing of one location between them.

The software consists essentially of two areas, an 'Input Routine' and an 'Output Routine'. The input routine action is initiated only when a zero crossing is detected by the ADC 30. When a zero crossing is detected the software zero crossing queue is incremented and the correct input peak is input to the peaks queue 21.

When a zero crossing is not detected at the input the software checks user programmable switches connected to the controller 31 and indicated by an arrow 38 to see if the required user function has changed. These functions are typically the transfer characteristic for the envelope level controller and the required amount of waveshape compression.

When a zero crossing occurs at the output of the delay line 10 as indicated by the zero crossings queue, a new gain value is calculated and passed to the MDAC 11.

The envelope control function is also updated at this instant.

Further details of the software and connections for the microprocessor controller will be apparent to those skilled in the use of microprocessors. The above mentioned British specification gives a more detailed indication of the programming of a microprocessor system of a generally suitable type.

While certain embodiments of the invention have been described it will be clear that the invention can be put into practice in many different ways. For example the division between hardware and software may be changed and as mentioned above it would be possible to perform the invention using hardware entirely. In the systems of FIGS. 2, 3 and 4 arrangements may be made to switch out, if required, either envelope control or waveshape compression. Further it is not essential that the magnitude of the input signal for waveshape compression is subject to gain control from the envelope control signal.

I claim:

1. Apparatus for automatic signal level adjustment comprising:
   control means for forming a first control signal which is a function of a weighted sum of a predetermined number, greater than one, of consecutive half cycle peak magnitudes of an input signal, whereby the first control signal is dependent on a frequency content of the input signal, and
   processing means for operating on the input signal using a first control transfer function which varies in accordance with the first control signal to provide an output signal which at least partly depends on the first control signal.

2. Apparatus according to claim 1 wherein the control means is also for changing a value of the first control signal at discrete intervals also dependent on the frequency content of the input signal.

3. Apparatus according to claim 1 wherein said control means is also for changing the function of said weighted sum more rapidly in response to successively increasing peak magnitudes than to successively decreasing peak magnitudes.

4. Apparatus according to claim 1 wherein said control means is also for changing the function of said weighted sum in the form of an average of the half cycle peak magnitudes.

5. Apparatus according to claim 1 wherein said control means includes a digital low pass filter for deriving the first control transfer function, said digital low-pass filter processing clocked at zero crossings of the input signal.

6. Apparatus according to claim 1 wherein the control means, in forming the weighted sum, weights peak magnitudes in dependence upon when said peak magnitudes occur in the input signal, and wherein at least some of the weights are different from others.

7. Apparatus according to claim 1 wherein the control means, in operation, delays the input signal by a predetermined amount before being operated upon using the first control transfer function, and the control means, in operation, detects peak magnitudes between zero crossings in the input signal prior to the delay of the input signal by the control means, forms a queue of the peak magnitudes, detects zero crossings in the input signal after the input signal has been delayed, and changes the first control signal each time a zero crossing is detected after the input signal has been delayed using, at least partly, a peak magnitude read from the queue at that time.

8. Apparatus according to claim 1 wherein the control means, in operation, derives a second control signal separate from said first control signal and representative of input signal peak magnitudes, each peak magnitude being derived over a respective portion of the input signal, and the control means is responsive to both said first and second control signals, and, in operation operates on each portion of the input signal using a second control transfer function which varies in accordance with the second control signal to vary the output signal partly in accordance with the second control signal derived from that portion with the result that at least a predetermined set of the said peak magnitudes are brought to substantially the same magnitude in the output signal.

9. Apparatus according to claim 8 wherein the control means is arranged to control the value of the second control signal in accordance with the value of the first control signal.

10. Apparatus according to claim 8 wherein the control means includes variable gain means connected in the path of the input signal, the control means being arranged to provide a gain control signal for the variable gain means by multiplying the first and second control signals together.

11. Apparatus according to claim 10 wherein the control means is arranged to form the logarithm of the input signal in deriving the first and second control signals, multiply the said control signals by the addition of logarithms, and cause the output of the variable gain means to be the antilog of the product of the input signal and the said gain control signal.

12. Apparatus according to claim 11 wherein the control means is arranged to control the value of the second control signal in accordance with the value of the first control signal by adding the first control signal and a logarithmic signal representative of input signal peak magnitudes in deriving the second control signal.

13. Apparatus according to claim 1 wherein the control means includes means to allow user selection of predetermined characteristics for the first control and/or second control transfer function.

14. A method of automatic signal level adjustment comprising the steps of
    forming a first control signal which is a function of a weighted sum of a predetermined number, greater than one, of consecutive peak magnitudes of an input signal, whereby the first control signal is a function of a frequency content of the input signal, and
    operating on the input signal using a first control transfer function which varies in accordance with the first control signal to provide an output signal which at least partly depends on the first control signal.

15. A method according to claim 14, comprising the further step of
    deriving a second control signal representative of input signal peak magnitudes, each peak magnitude being derived over a respective portion of the input signal, and
    wherein said operating step includes operating on each portion of the input signal using a second control transfer function which varies in accordance with the second control signal to vary the output signal at least partly in accordance with the value of the second control signal derived for that portion with the result that at least a predetermined set of the said peak magnitudes are brought to substantially the same magnitude in the output signal.

* * * * *